US00RE45238E

(19) United States
(12) Reissued Patent
Fukuda et al.

(10) Patent Number: US RE45,238 E
(45) Date of Reissued Patent: Nov. 11, 2014

(54) SILICON WAFER AND METHOD OF MANUFACTURING THE SAME

(71) Applicant: Siltronic AG, Munich (DE)

(72) Inventors: Masayuki Fukuda, Yamaguchi (JP); Katsuhiko Nakai, Yamaguchi (JP)

(73) Assignee: Siltronic AG, Munich (DE)

(21) Appl. No.: 13/766,020

(22) Filed: Feb. 13, 2013

Related U.S. Patent Documents

Reissue of:
(64) Patent No.: 8,343,618
Issued: Jan. 1, 2013
Appl. No.: 12/637,850
Filed: Dec. 15, 2009

(30) Foreign Application Priority Data

Dec. 26, 2008 (JP) ..... 2008-332424

(51) Int. Cl.
*B32B 7/02* (2006.01)
*B32B 27/36* (2006.01)

(52) U.S. Cl.
USPC ..... 428/212; 428/220; 428/348; 428/500; 438/471; 438/473; 438/775; 117/2; 117/3; 117/106

(58) Field of Classification Search
USPC ..... 428/212, 220, 348, 500; 438/471, 473, 438/775; 117/2, 3, 106
See application file for complete search history.

(56) References Cited

U.S. PATENT DOCUMENTS

| | | | | |
|---|---|---|---|---|
| 6,893,499 | B2 * | 5/2005 | Fusegawa et al. | 117/13 |
| 7,781,715 | B2 | 8/2010 | Uya et al. | |
| 8,197,594 | B2 | 6/2012 | Nakai et al. | |
| 2007/0240628 | A1 | 10/2007 | Watanabe et al. | |
| 2008/0283726 | A1 | 11/2008 | Uya et al. | |
| 2010/0047563 | A1 | 2/2010 | Nakai et al. | |
| 2010/0291730 | A1 | 11/2010 | Uya et al. | |

FOREIGN PATENT DOCUMENTS

| | | | |
|---|---|---|---|
| EP | 2 144 280 | A1 | 1/2010 |
| JP | 01098047 | A | 4/1989 |
| JP | 2006040980 | A | 2/2006 |
| JP | 2006269896 | A | 10/2006 |
| JP | 2007-305968 | A | 11/2007 |
| JP | 2007305968 | A | 11/2007 |
| JP | 2008160069 | A | 7/2008 |
| JP | 2008166516 | A | 7/2008 |
| JP | 2008213403 | A | 9/2008 |
| KR | 2008-0026526 | | 3/2008 |
| WO | 2008/136500 | | 11/2008 |
| WO | 2008136500 | | 11/2008 |

OTHER PUBLICATIONS

Katsuhiko Nakai et al., A new data processing method to determine accurate density and size distribution of defects by bright field infrared laser interferometer (optical precipitate profiler), Review of Scientific Instruments, vol. 69, No. 9, Sep. 1998, pp. 3283-3289.

* cited by examiner

*Primary Examiner* — Aaron Austin
*Assistant Examiner* — Lawrence Ferguson
(74) *Attorney, Agent, or Firm* — Brooks Kushman P.C.

(57) ABSTRACT

A silicon wafer in which both occurrences of slip dislocation and warpage are suppressed in device manufacturing processes is a silicon wafer having BMDs having an octahedral shape, wherein BMDs located at a position below the silicon wafer surface to a depth of 20 μm and having a diagonal length of 200 nm or more are present at a concentration of $\leq 2\times10^{9}/cm^{3}$, and BMDs located at a position below a depth ≥50 μm have a diagonal length of ≥10 nm to ≤50 nm and a concentration of $\geq 1\times10^{12}/cm^{3}$.

8 Claims, No Drawings

SILICON WAFER AND METHOD OF MANUFACTURING THE SAME

Matter enclosed in heavy brackets [ ] appears in the original patent but forms no part of this reissue specification; matter printed in italics indicates the additions made by reissue.

CROSS-REFERENCE TO RELATED APPLICATIONS

This application claims priority to Japanese Patent Application No. JP2008-332424 filed Dec. 26, 2008, which is herein incorporated by reference.

BACKGROUND OF THE INVENTION

1. Field of the Invention

The present invention relates to a silicon wafer, and to a method of manufacturing the same, which can suppress occurrence of slip dislocations and warpage in semiconductor wafer manufacturing, in particular, in device manufacturing processes.

2. Background Art

Silicon wafers used as a substrate for semiconductor devices or the like are manufactured by slicing a silicon single-crystal ingot and performing heat treatment, mirror polishing, and other conventional processing steps. As a method of manufacturing a silicon single-crystal ingot, for example, the Czochralski method (CZ method) is generally used. The CZ method occupies a large part of manufacturing of silicon single-crystal ingots because a large-diameter single-crystal ingot can be easily obtained, and defects can be controlled relatively easily.

In a silicon single crystal pulled by the CZ method (referred to as "CZ—Si"), crystal defects called grown-in defects are present. The CZ—Si includes oxygen between lattices in an oversaturated state. However, the oversaturated oxygen causes a microscopic defect called a Bulk Micro Defect ("BMD") by a heat treatment (annealing) performed later.

In order to form a semiconductor device from a silicon wafer, crystal defects are required to be absent in the semiconductor device forming region. When a crystal defect is present on a surface for forming a circuit, the defective portion causes circuit breakdown or other defects. On the other hand, an appropriate number of BMDs are required to be present in the silicon wafer. This is because the BMDs function to getter metal impurities which cause semiconductor devices to malfunction.

In order to satisfy the above requirements, high-temperature annealing of the silicon wafer to induce BMD formation in the silicon wafer to form an Intrinsic Gettering layer ("IG layer") can also eliminate grown-in defects present on the surface of the silicon wafer to form a Denuded Zone ("DZ layer") layer having an extremely small number of crystal defects.

As a concrete example, JP published application 10-98047 discloses a method which performs high-temperature annealing of a nitrogen-containing substrate to reduce grown-in defects on the surface and forms BMDs having nitrogen as nuclei in the substrate.

However, the DZ layer formed on the upper and lower surfaces of the silicon wafer by the high-temperature annealing process has an oxygen concentration which is extremely low because of outward diffusion of oxygen during heat treatment. As a result, the ability to reduce propagation of dislocation defects on the upper and lower surfaces of the wafer is extremely low. For this reason, due to micro-scratches on the upper and lower surfaces caused in the annealing step, dislocation defects ("slip") easily propagate in the bulk. Propagation of slip dislocations undesirably decreases the strength of the silicon wafer. For example, when a wafer is annealed while being supported by a heat treatment susceptor or the like, slip dislocations frequently extend from a supported portion at the periphery of the wafer to the lower surface of the wafer. The slip dislocation may extend from a silicon wafer edge, for example.

When the strength of the silicon wafer is deteriorated, the wafer may be damaged during the manufacturing steps, or the wafer may be broken. However, the DZ layer is indispensable to manufacturing of a semiconductor device. A silicon wafer having, at the same time, a DZ layer and excellent strength characteristics is desired.

In the conventional technique described in JP 10-98047 deterioration of the strength of a silicon wafer is not considered. A silicon wafer formed by the above method cannot avoid slip dislocation propagation.

On the other hand, in order to prevent occurrence of slip dislocations, a method which generate BMDs at a high concentration has also been proposed. More specifically, a silicon wafer manufacturing method has been proposed in which a rapid heating/cooling rate heat treatment is performed on a wafer in a mixed atmosphere of nitrogen and inert gas, or ammonia and inert gas, at a temperature of 500° C. to 1200° C. for 1 minute to 600 minutes to form oxygen precipitation nuclei having a size of 20 nm or less in a BMD layer at a concentration of $1\times10^{10}/cm^3$ or more (JP published application 2006-40980). JP published application 2006-269896 discloses a silicon wafer manufacturing method in which heat treatment is performed on a silicon wafer having an oxygen concentration of $1.2\times10^{18}$ atoms/$cm^3$ to $1.4\times10^{18}$ atoms/$cm^3$ and a carbon concentration of $0.5\times10^{16}$ atoms/$cm^3$ to $2\times10^{17}$ atoms/$cm^3$ in a non-oxidizing atmosphere under the conditions: a temperature of 1100° C. to 1250° C.; for 1 hour to 5 hours; and a temperature ramp of 0.1 to 1° C./minute over a temperature range of 1100° C. to 1250° C., to form BMDs each having a size of 150 nm or less at a concentration of $5\times10^{9}/cm^3$ or more. A silicon wafer in which a heat treatment is repeated several times to generate BMDs at a high concentration ($1\times10^{10}/cm^3$ to $1\times10^{12}/cm^3$) is proposed in JP published application 08-213403. Furthermore, a silicon wafer in which BMDs each of which is located at a position having a depth of 50 μm from a surface and has a size of 10 nm or more to 50 nm or less are formed at a concentration of $5\times10^{11}/cm^3$ to suppress slip and warpage is proposed in JP published application 2008-160069.

However, in recent years, as the silicon wafers have increased in diameter, and as the integration density of semiconductor device patterns has increased, warpage of the wafer becomes problematic in addition to occurrence of slip dislocation.

As heat treatment furnaces, a batch type heat treatment furnace and an RTA are known. Slip propagates from a contact between the lower surface of a silicon wafer edge and a silicon wafer holding portion or a silicon wafer edge portion. The propagating slip extends in the [110] direction, and, depending on circumstances, the silicon wafer may be damaged or broken. Warpage is a phenomenon in which a silicon wafer is deformed by thermal distortion in a heat treatment. Warpage of a silicon wafer before heat treatment to give desired characteristics is suppressed to 10 μm or less. However, when heat treatment is performed, the difference between a peak and a trough of the warped wafer reaches several tens of micrometers. A semiconductor device pattern cannot correctly be exposed (photolithography) on such a warped wafer surface and thus causes a decrease in yield of semiconductor devices.

The problem of warpage is particularly conspicuous when a wafer diameter is 200 mm or more. In particular, problems caused by warpage in a batch type heat treatment cannot be solved without giving attention to BMD concentration and size in the surface layer. As described above, even when BMDs are controlled so as to be formed at a position having a depth of 50 μm or more and to have small sizes, the problem cannot be avoided.

SUMMARY OF THE INVENTION

An object of the invention is to provide a method of manufacturing a silicon wafer which has a DZ layer having an appropriate area and establishes a BMD concentration which can suppress occurrences of slip dislocation and warpage in device manufacturing processes. These and other objects are achieved by a process of heat treating a wafer having specified nitrogen and carbon dopant levels, the heat treating including at least a low temperature treatment, a ramped temperature increase to 850° C., followed by a high temperature treatment, the wafer thus treated characterized by octahedral BMDs in high concentration in the wafer interior (bulk), and BMDs of lower concentration near the surface.

DETAILED DESCRIPTION OF THE PREFERRED EMBODIMENT(S)

The present inventors obtained the following knowledge to arrive at the present invention. That is, for BMDs immediately below a DZ layer, BMDs each having a size of 200 μm or more are controlled at a concentration of $2\times10^9/cm^3$ or less and BMDs in the bulk at a depth of 50 μm or more, having a size of ≥10 nm and ≤50 nm are controlled to a density of $1\times10^{12}/cm^3$ or more, so that occurrences of slip and warpage caused by a batch type heat treatment furnaces in device manufacturing processes can be suppressed.

In a batch type heat treatment, a temperature difference between a wafer peripheral portion and a wafer central portion increases. As a result, stress deforms the wafer into a convex shape or a concave shape. The stress acting at this time is zero at a center of thickness and increases toward a portion near the surface of the wafer. Dislocations originating from BMDs is a cause of warpage. When the size of the BMD is large, dislocation easily occurs. Therefore, when a BMD having a large size is present near a surface of a wafer having large stress, dislocation occurs from the BMD, and the wafer is easily warped. The present inventors found that control of a concentration and a size of BMDs being present at a relatively deep position (a position having a depth of 50 μm or more) in a wafer was not important to improvement of warpage characteristics; rather, control of concentration and size of BMDs near a surface layer (a position having a depth of 20 μm or less) was very effective in improving the warpage characteristics. None of the conventional techniques described in references cited previously controls concentration and size of BMDs located at a position shallower than a surface by 20 μm or less. For this reason, in the conventional techniques, wafer warpage characteristics in a batch type heat treatment cannot be improved.

More specifically, the present invention relates to a silicon wafer which deposits BMDs at a high concentration in the bulk to suppress slip dislocation and decreases concentration of BMDs near the surface where maximum heat stress is generated in a batch type heat treatment to suppress warpage, and a method of manufacturing the silicon wafer. The present invention includes the following embodiments.

(1) A silicon wafer having BMDs having an octahedral shape, characterized in that BMDs located at a position shallower than a depth of 20 μm from the silicon wafer surface have a diagonal length of ≥200 nm, and a concentration of $\leq2\times10^9/cm^3$ and BMDs located at a position having a depth of ≥50 μm have a diagonal length of ≥10 nm to ≤50 nm at a concentration of $1\times10^{12}/cm^3$ or more.

(2) A method of manufacturing the silicon wafer described in (1), characterized in that a nitrogen concentration of a substrate is $\geq5\times10^{14}$ atoms/$cm^3$ to $\leq1\times10^{16}$ atoms/$cm^3$ or less, a carbon concentration is $\geq1\times10^{15}$ atoms/$cm^3$ to $\leq3\times10^{16}$ atoms/$cm^3$ is employed, and a heat treatment is employed, including:

(A) a low-temperature heat treatment step treatment in a temperature range of ≥650° C. to ≤750° C. for a required time of ≥30 minutes to ≤5 hours;

(B) furthermore, a heat treatment which increases the temperature in a temperature range of up to 850° C. at a rate of 0.5° C./minute to ≤2° C./minute;

(C) a cooling and extracting step of decreasing the temperature of the furnace at a cooling rate of ≥1° C./minute to ≤10° C./minute, and extracting the substrate from the furnace at ≥600° C. to =750° C. and cooling the substrate to room temperature, and (D) a high-temperature heat treatment comprising setting the furnace temperature to ≥600° C. to ≤750° C. after step (C), inserting the substrate into the furnace, raising the temperature of the furnace in the temperature range of <1100° C. at a rate of ≥5° C./minute to ≤10° C./minute, raising the temperature in the temperature range of ≥1100° C. to ≤1250° C. at a rate of ≥1° C./minute to ≤2° C./minute, and holding the temperature at ≥1000° C. to ≤1250° C. to provide a diffusion length of interstitial oxygen of 50 μm or more.

(3) A method of manufacturing the silicon wafer described in (1), characterized in that a nitrogen concentration of a substrate is $\geq5\times10^{14}$ atoms/$cm^3$ to $\leq1\times10^{16}$ atoms/$cm^3$, a carbon concentration is $\geq1\times10^{15}$ atoms/$cm^3$ to $\leq3\times10^{16}$ atoms/$cm^3$ is employed;

a heat treatment is employed, including:

(A) a low-temperature heat treatment step in a temperature range of ≥650° C. to ≤750° C. or less for a required time of ≥30 minutes to ≤5 hours;

(B) furthermore, a heat treatment which increases the temperature in a temperature range of up to 850° C. at a rate of ≥0.5° C./minute to ≤2° C./minute; and (C) furthermore, a high-temperature heat treatment in which heating up to <1100° C. is performed at a rate of ≥5° C./minute to ≤10° C./minute and in the temperature range of ≥1100° C. to ≤1250° C. at a rate of ≥1° C./minute to ≤2° C./minute, and the temperature is held at ≥1000° C. to ≤1250° C. to provide a diffusion length of interstitial oxygen of 50 μm or more.

According to the present invention, a BMD having an octahedral shape means a BMD having a shape surrounded by a plurality of {111} planes and other planes. In general, the shapes includes a shape surrounded by eight {111} planes and a shape surrounded by {111} planes and {100} planes. Planes other than {111} plane and {100} planes may appear.

The shapes of BMDs present in a wafer may also include a plate-like shape other than the octahedrons. A plate-like BMD is a BMD having a shape surrounded by two {100} planes which are relatively large, and other planes. An inside of the BMD may have a tree-like shape. Discrimination between the octahedral shape and the plate-like shape is performed as follows. Of sizes in a [100] direction and a [010] direction when viewed in a [001] direction, a long size is defined as A, and a short size is defined B. In this case, a shape having a ratio of A/B (referred to as an "oblateness" hereinafter) of 1.5 or less is defined as an octahedron, and a shape having a ratio of A/B of larger than 1.5 is defined as a plate-like shape. Since BMD shapes in the silicon wafer fluctuate, determination whether the shape of a BMD being present in a wafer is an octahedral shape or a plate-like shape may be performed as follows. That is, the A/B ratios of a plurality of BMDs at different positions in a wafer are measured, an average of the A/B ratios (referred to as an "average oblateness" hereinafter) is calculated, and it is determined whether the value exceeds 1.5. When this value exceeds 1.5, states of distortion acting on crystal lattices around the BMDs are different from each other. For this reason, an optimum BMD size distribution to suppress occurrences of slip and warpage is different from that in the spirit and scope of the invention.

In the present invention, a diagonal length of an octahedron BMD means a longer one A of lengths in the [100] direction and the [010] direction.

In a silicon wafer according to the present invention which is a silicon wafer having BMDs having an octahedral shape, BMDs having a diagonal length of 200 nm or more for BMDs located at positions to a depth of 20 μm from a surface of the silicon wafer have a concentration of $\leq 2\times10^{9}/cm^{3}$, and BMDs having a diagonal length of 10 nm or more to 50 nm or less for BMDs located at a position having a depth of 50 μm or more have a concentration of $\geq 1\times10^{12}/cm^{3}$. For this reason, occurrences of slip and warpage in device manufacturing processes are extremely minimized, the silicon wafer can be prevented from being deteriorated in strength while still having a DZ layer, and large-scale (typically, 200 mm) high-quality devices can be manufactured.

In the silicon wafer according to the present invention, in comparison with a mirror wafer being free from BMDs therein, slip dislocation and warpage do not easily occur, and a high gettering capability can be obtained.

The present invention will be described below in detail with reference to certain preferred embodiments.

A silicon wafer according to the present invention is characterized in that occurrences of both slip and warpage in device manufacturing processes can be extremely minimized. In this case, dimensions (diameter and thickness) of a wafer in which the present invention is realized and the presence/absence of dopants of various elements are not limited to specific ones. These characteristic features can be appropriately selected depending on the type of required semiconductor silicon wafer.

Semiconductor device manufacturing by using the silicon wafer according to the present invention is not limited to a specific method. The present invention can be applied to manufacturing of various semiconductor devices. More specifically, a silicon wafer according to the present invention can be widely used in manufacturing of a wafer having a surface on which an epitaxial layer is formed, a silicon on insulator (SOI) wafer, an SIMOX wafer to which SIMOX (Separation By Implanted Oxygen) process is performed, and an SiGe wafer having a surface on which an SiGe layer is formed.

As the characteristic features of the silicon wafer according to the present invention, the silicon wafer has BMDs having an octahedral shape, BMDs having a diagonal length of ≥200 nm for BMDs located at a position having a depth of 20 μm from a surface of the silicon wafer have a concentration of $\leq 2\times10^{9}/cm^{3}$, and BMDs having a diagonal length of ≥10 nm to ≤50 nm for BMDs located at a position having a depth of 50 μm or more have a concentration of $\geq 1\times10^{12}/cm^{3}$.

More specifically, in the silicon wafer having BMDs each having an octahedral shape, BMDs located at a position having a depth within 20 μm from a surface influence a warpage characteristic. Furthermore, BMDs each having a diagonal length of ≥10 nm to ≤50 nm and located at a position having a depth of ≥50 μm influence slip suppressing characteristics. In general device manufacturing processes, occurrences of warpage and slip can be extremely minimized. In this manner, even though slip occurs from a wafer support portion in the device manufacturing processes, the slip can be prevented from penetrating a silicon wafer surface. Even though slip occurs from a wafer edge portion, the slip can be prevented from reaching a semiconductor device forming region, and the slip can be prevented from adversely affect the device.

When diagonal lengths of BMDs located at a position having a depth of ≥50 μm are smaller than 10 nm, or when a concentration of BMDs is smaller than $1\times10^{12}/cm^{3}$, the BMDs do not easily serve as sufficient barriers to slip propagation. Although the density and diagonal lengths of BMDs which can serve as barriers to slip propagation do not have upper limits, for the reason (described later), in a range which can be realized by an actual silicon wafer, the upper limit of the diagonal length of the BMD is 50 nm. More specifically, when BMDs are present at a high concentration, almost all solid solution oxygen is precipitated as BMDs. On the other hand, the number of oxygen atoms precipitated as BMDs does not exceed the number of oxygen atoms dissolved in CZ—Si, and the solid solution oxygen concentration is $1\times10^{18}$ atoms/cm$^3$ at most. Therefore, when the BMDs are present at a high concentration, the concentration of the oxygen atoms precipitated as BMDs may be constant at about $1\times10^{18}$ atoms/cm$^3$. In this state, when the BMD concentration increases, diagonal lengths decrease. More specifically, the diagonal lengths of BMDs which are present at a certain concentration or more have an upper limit, and the BMDs having a concentration of $1\times10^{12}/cm^{3}$ cannot be realized by BMDs each having a diagonal length of larger than 50 nm. Therefore, the ranges of the concentration and the diagonal length of BMDs which can suppress slip propagation are $\geq 1\times10^{12}/cm^{3}$ and ≥10 nm to ≤50 nm, respectively.

For this purpose, an interstitial oxygen concentration is preferably $5\times10^{17}$ atoms/cm$^3$ or less. On the other hand, the lower limit of the interstitial oxygen concentration may be about $2\times10^{17}$ atoms/cm$^3$. The interstitial oxygen concentration cannot be easily further decreased because an extended heat treatment must be performed at a low temperature.

The BMD size distribution and the interstitial oxygen concentration described above are desirably realized over an entire surface of a wafer. However, depending on applications, the distribution and the concentration may be realized in a partial region. For example, when only a typical slip brought from an edge portion of the wafer is prevented, in a region distanced from a wafer center by 80% or more of a wafer radius, the BMD size distribution and the interstitial oxygen concentration may be able to be realized. This is because a slip brought from the edge portion of the wafer frequently occurs in the region distanced from the wafer center by 80% or more of the wafer radius. In order to prevent only warpage of a typical wafer, the BMD size distribution and the interstitial oxygen concentration may be able to be realized in the inside region having 80% or less of the wafer radius. This is because high-concentration dislocation inside a typical wafer which causes warpage frequently occurs in a region having 80% or less of the wafer radius.

The silicon wafer according to the present invention is excellent in that slip and warpage occurring in device manufacturing processes are small. More specifically, a silicon wafer according to the present invention, in particular, a silicon wafer in which BMDs are controlled as described above and an interstitial oxygen concentration is reduced, is characterized in that a length of a slip occurring in the following heat treatment is very small (typically, the length of the slip is 10 mm or less, and an amount of warpage obtained after the heat treatment is 10 μ or less).

More specifically, as a test to evaluate slip and resistance to warpage in device manufacturing processes, a heat treatment which holds a furnace temperature at 900° C., inserts a wafer into the furnace, and holds the temperature at 1100° C. for 30 minutes, can be used.

In the heat treatment, in a temperature range in which slip and warpage easily occur, thermal stress is practically maximum. For this reason, when dislocation is prevented from occurring at a heating/cooling rate in the temperature range, it can be said that the silicon wafer according to the present invention is a silicon wafer in which slip and warpage minimally occur in almost all the device manufacturing processes.

In order to measure the shapes and diagonal lengths of the BMDs and the number of BMDs described above, known measuring methods can be generally used. More specifically, a method performed by a transmission electron microscope (to be referred to as a "TEM" and an infrared interference and a method of Optical Precipitate Profiler (to be referred to as an "OPP" hereinafter) are given.

Methods of measuring and evaluating slip dislocation and the amount of warpage of a wafer are not limited. The slip dislocation and the amount of warpage can be generally measured by any known method. More specifically, an X-ray topograph is used to measure slip dislocation. The amount of warpage can be observed and evaluated by using FT-90A available from NIDAK corporation.

Furthermore, in order to measure an interstitial oxygen concentration, Fourier transformation infrared absorption spectroscopy (FTIR) can be used.

The silicon wafer according to the present invention has the characteristic features described above. Therefore, methods to manufacture silicon wafers having the characteristic features are arbitrarily used. More specifically, single crystal growing conditions (crystal pulling rate, crystal cooling rate, crucible rotation, gas flow, and the like) and heat treatment conditions (heat treatment temperature, time, heating/cooling rates and the like) are appropriately controlled to make it possible to manufacture a silicon wafer having the above characteristic features.

In the present invention, in particular, a heat treatment for a substrate is preferably performed in steps. In this case, the substrate means a silicon wafer on which a heat treatment has not been performed, and also means a substrate which is cut out of a single crystal ingot and to which steps such as chamfering, other than the heat treatment, are performed.

The size (diameter, thickness, and the like) and the presence/absence of dopants of various elements are not especially limited. The size and the presence/absence of dopants can be appropriately selected depending on the type and performance of the required silicon wafer.

The interstitial oxygen concentration included in the substrate may be the oxygen concentration obtained in a silicon single crystal grown by the CZ method under normal conditions. When the substrate is manufactured by the heat treatment described below, preferably, the concentration falls within a range of $\geq 8.0\times10^{17}$ atoms/cm$^3$ to $\leq 9.5\times10^{17}$ atoms/cm$^3$. When the oxygen concentration falls out of this range, BMDs are not formed at a high concentration, or BMDs having a large size are undesirably present in a high concentration.

In the present invention, divided heat treatments more preferably include (A) a low-temperature heat treatment in a temperature range of ≥650° C. to ≤750° C. for a required time of ≥30 minutes to ≤5 hours, (B), a heat treatment which increases the temperature up to 850° C. at a rate of ≥0.5° C./minute to ≤2 C./minute, (C) a cooling and extracting step of decreasing the temperature of the furnace at a cooling rate of ≥1° C./minute to ≤10° C./minute after the heating step (B) and extracting the substrate from the furnace when the temperature of the furnace is ≥600° C. to ≤750° C. and cooling the substrate to room temperature, and (D) a high-temperature heat treatment at a furnace temperature of ≥600° C. to ≤750° C. after step (C), inserting the wafer into the furnace, raising the temperature of the furnace in the temperature range of up to 1100° C. at a rate of ≥5° C./minute to ≤10° C./minute, raising the temperature in the temperature range of ≥1100° C. to ≤1250° C. at a rate of ≥1° C./minute to ≤2° C./minute, and holding the temperature at ≥1000° C. to 1250° C. to provide a diffusion length of interstitial oxygen of 50 μm or more.

A batch heat treatment in the present invention more preferably includes (A) a low-temperature heat treatment in a temperature range of ≥650° C. to ≤750° C. for a time of ≥30 minutes to ≤5 hours, (B), a heat treatment which increases the temperature up to 800° C. at a rate of ≥0.5° C./minute to ≤2° C./minute, and (C), a high-temperature heat treatment which increases the temperature in a temperature range up to <1100° C. at a rate of ≥5° C./minute to ≤10° C./minute and increases the temperature in a temperature range of ≥1100° C. to ≤1250° C. at a rate of ≥1° C./minute to ≤2° C./minute, and holds a constant temperature at ≥1000° C. to ≤1250° C. to provide a diffusion length of inter-lattice oxygen of 50 μm or more.

In step (A), since oxygen is not sufficiently diffused when heat treatment temperature is lower then 650° C., it is not likely that BMD formation sufficiently occurs. On the other hand, when the temperature exceeds 750° C., the heat treatment rarely influences optimization of BMDs, and waste undesirably increases. If the time for the heat treatment is less than 30 minutes, the time required for BMD nucleus formation is not sufficient. When the time exceeds 5 hours, productivity undesirably extremely decreases.

Furthermore, in step (B), when the heating rate is lower than 0.5° C./minutes, a stable heating rate cannot be obtained. When the heating rate exceeds 2° C./minute, precipitated BMDs are undesirably not eliminated.

The high-temperature heat treatment step (D) is to outwardly diffuse interstitial oxygen to form a DZ layer. In this step, a holding temperature <1000° C., is not preferable because a long time is required to outwardly diffuse interstitial oxygen resulting in a decreased production rate. When the holding temperature exceeds 1250° C., the quality of the components of the annealing furnace is undesirably extremely deteriorated. The diffusion length of the interstitial oxygen is a numerical value calculated on the basis of temperature and time in the step. More specifically, the numerical value can be calculated by the following equation (i).

$$\text{Diffusion length } (\mu\text{m}) \text{ of interstitial oxygen} = 2\times10^4 \times (D\times\text{time (second)})^{0.5}$$

where $$D(\text{cm}^2/\text{second}) = 0.17\times\exp(-2.53\div8.62\times10^{-5}\div\text{temperature (K)})$$

In this manner, a heat treatment which obtains a diffusion length 50 μm or more is preferable to form a large-sized DZ layer having a width of 5 μm or more.

An extracting step is added to the heat treatment when two heat treatment furnaces are used and when a low-temperature heat treatment and a high-temperature heat treatment are performed in different furnaces. When the respective heat treatments are performed in different furnaces to improve productivity, the cooling and extracting step is preferably added to divide the heat treatments into a low-temperature heat treatment and a high-temperature heat treatment.

A cooling rate in the cooling and extracting step is preferably ≥1° C./minute to ≤10° C./minute, which can be realized by a general furnace. The temperature of the furnace when the substrate is extracted is undesirably lower than 600° C. because the life of the heater in the furnace is shortened. The temperature undesirably exceeds 750° C. because components of the furnace are deteriorated.

The temperature of a furnace when a wafer is inserted for the high-temperature heat treatment is undesirably lower than 600° C. and undesirably higher than 750° C. for the same reason as the cooling and extracting step. A heating rate up to 1100° C. is preferably ≥5° C./minute to ≤10° C./minute which can be realized by a general furnace, and a heating rate in a temperature range of ≥1100° C. to ≤1250° C. or less is preferably ≥1° C./minute to ≤2° C./minute. The temperature and range for the diffusion length of oxygen in a heat treatment at ≥1000° C. or more are is described above. A cooling rate and a pulling temperature after the high-temperature heat treatment is performed are not limited to specific ones.

The apparatus used in the series of heat treatments described above is not limited to a specific one, and a conventional apparatus is preferably used. More specifically, a normal batch type vertical furnace, a batch type vertical furnace with an oxygen purge function, and the like are useful.

In the manufacturing method according to the present invention, the substrate preferably contains nitrogen. This is because substrates containing nitrogen can suppress warpage to a lower level (typically, 15 μm or less). In this manner, the warpage is further suppressed, so that a higher-performance device can be manufactured. The concentration of nitrogen added for this purpose is preferably $\geq 5\times10^{14}$ atoms/cm$^3$ to $\leq 1\times10^{16}$ atoms/cm$^3$. When the concentration exceeds this range, polycrystallization undesirably occurs or yield may be decreased.

In the manufacturing method according to the present invention, the substrate preferably contains carbon. This is because carbon-containing substrates advantageously form BMDs even though the low-temperature heat treatment is performed at a low temperature for a comparatively short period of time. A concentration of carbon added for this purpose is preferably $\geq 1\times10^{15}$ atoms/cm$^3$ to $\leq 3\times10^{16}$ atoms/cm$^3$. When carbon is added at a concentration higher than the above range, the production yield disadvantageously decreases in crystal manufacturing.

Furthermore, when the concentration is lower than the range, the BMD concentration in the bulk is difficult to be $1\times10^{12}$/cm$^3$ or more. The carbon concentration is more preferably $2\times10^{16}$ atoms/cm$^3$ or less.

Methods of adding nitrogen and carbon to a substrate are not limited to specific methods, and a conventional method is preferably used. More specifically, as a method of adding nitrogen, a substrate with nitride film is added to a single-crystal pulling melt to make it possible to adjust the nitrogen concentration of the obtained substrate. As a method of adding carbon, carbon powder is added to a single-crystal pulling melt to make it possible to adjust the carbon concentration of the obtained substrate.

Methods of measuring the concentrations of nitrogen, carbon, and oxygen contained in a substrate are not limited to specific methods, and the concentrations are preferably measured by conventionally known methods. More specifically, in measurement of a nitrogen concentration, the nitrogen concentration a secondary ion mass analyzing apparatus (SIMS) can be used. The oxygen concentration and the carbon concentration are measured by an infrared absorption method, and can be calculated as converted coefficients by a value of Japan Electronics and Information Technology Industries Association (JEITA).

EXAMPLES

The present invention will be described below in detail by examples. However, the present invention is not limited to the examples.

Method of Manufacturing Annealed Wafer

Single-crystal ingots were manufactured under various conditions (wafer diameter, conductivity type, oxygen, nitrogen, carbon concentration), and the same portions of straight body parts of the single-crystal ingots were cut by using a wire saw. The portions obtained by performing mirror processing having a thickness of 725 μm or more to 750 μm or less were used as substrates. Annealed wafers were manufactured from the substrates by the following method.

Divided Heat Treatment

A substrate was put in a first batch type vertical heat treatment furnace, and a low-temperature heat treatment was performed to the substrate. The substrate was then put into a second vertical heat treatment furnace, and a high-temperature heat treatment was performed in an argon gas atmosphere. A diffusion length of interstitial oxygen in the high-temperature heat treatment was obtained by integrating the equation (i) according to a temperature pattern of the high-temperature heat treatment. Heat treatment conditions of the examples and comparative examples will be described below.

Batch Heat Treatment

The substrate was put in a batch type vertical heat treatment furnace, a low-temperature heat treatment and a high-temperature heat treatment were performed in an argon gas atmosphere in the same furnace. A diffusion length of interstitial oxygen in the high-temperature heat treatment was obtained by integrating the equation (i) according to a temperature pattern of the high-temperature heat treatment. Heat treatment conditions of the examples and the comparative examples will be described below.

Examples of Heat Treatment

Examples 1 to 3

At 700° C. for 4 hours, temperature was raised to 800° C. at 1°/minute, at 800° C. for 0 hour, temperature was decreased at 3° C./minute, substrate was extracted at 700° C. and cooled to a room temperature, substrate was inserted at 700° C., temperature raised at below 1100° C. at 5° C./minute, temperature was raised at 1100° C. or more at 1° C./minute, held at 1200° C. for 5 hours.

Example 4

At 700° C. for 4 hours, temperature was raised to 750° C. at 0.5° C./minute, at 750° C. for 0 hour, temperature was decreased at 3° C./minute, substrate was extracted at 700° C.

and cooled to room temperature, substrate was inserted at 700° C., temperature raised at lower than 1100° C. at 5° C./minute, temperature was raised at 1100° C. or more at 1° C./minute, at 1200° C. for 5 hours.

Example 5

At 700° C. for 4 hours, temperature was raised to 800° C. at 0.5° C./minute, temperature was raised to 1100° C. at a 8° C./minute, temperature raised at 1100° C. or more at 1° C./minute, at 1200° C. for 5 hours.

Comparative Examples 1 to 4

At 700° C. for 4 hours, temperature was raised to 800° C. at 1° C./minute, at 800° C. for 0 hour, temperature was decreased at 3° C./minute, substrate was extracted at 700° C. and cooled to a room temperature, substrate was inserted at 700° C., temperature raised at below 1100° C. at 5° C./minute, temperature was raised at 1100° C. or more at 1° C./minute, held at 1200° C. for 1 hour Comparative Example 5

At 700° C. for 4 hours, substrate was extracted at 700° C. and cooled to a room temperature, substrate was inserted at 700° C., temperature raised below 1100° C. at 5° C./minute, temperature was raised at 1100° C. or more at 1° C./minute, held at 1200° C. for 1 hour.

Comparative Example 6

At 700° C. for 4 hours, temperature was raised to 800° C. at 0.5° C./minute, at 800° C. for 0 hour, temperature was decreased at 3° C./minute, substrate was extracted at 700° C. and cooled to a room temperature, substrate was inserted at 700° C., temperature raised below 1100° C. at 5° C./minute, temperature was raised at 1100° C. or more at 1° C./minute, held at 1200° C. for 1 hour.

Manufacturing conditions of the wafers (Examples 1 to 5 and Comparative Examples 1 to 6)(wafer diameter, conductivity type, concentrations (nitrogen, oxygen, and carbon) in a substrate, and diffusion lengths of interstitial oxygen in each heat treatment) are listed in Table 1. In this table, P-type is boron doped, and N-type is phosphorous doped. Adjustment and measurement of concentrations of inclusions (oxygen and the like) are performed according to normal methods.

TABLE 1

| No. | Wafer Diameter (mm) | Conductivity Type | Nitrogen (atoms/cm$^3$) | Oxygen (atoms/cm$^3$) | Carbon (atoms/cm$^3$) | Diffusion Length of Interlattice Oxygen in High-Temperature Heat Treatment (μm) |
|---|---|---|---|---|---|---|
| Example 1 | 200 | P | 1.3E+15 | 9.2E+17 | 1.5E+15 | 52 |
| Example 2 | 200 | P | 1.4E+15 | 9.0E+17 | 3.5E+15 | 52 |
| Example 3 | 200 | N | 1.9E+15 | 9.3E+17 | 2.6E+15 | 52 |
| Example 4 | 200 | P | 1.6E+15 | 9.2E+17 | 4.7E+15 | 52 |
| Example 5 | 200 | P | 2.4E+15 | 8.8E+17 | 8.1E+15 | 52 |
| Comp. Example 1 | 200 | P | 1.3E+15 | 9.2E+17 | 1.5E+15 | 23 |
| Comp. Example 2 | 200 | N | 1.9E+15 | 9.3E+17 | 2.6E+15 | 23 |
| Comp. Example 3 | 200 | P | 3.3E+15 | 8.6E+17 | 1.0E+16 | 23 |
| Comp. Example 4 | 200 | P | 1.4E+15 | 9.0E+17 | 3.5E+15 | 23 |
| Comp. Example 5 | 200 | P | 1.4E+15 | 8.7E+17 | 3.3E+15 | 23 |
| Comp. Example 6 | 200 | P | 3.2E+15 | 8.6E+17 | 1.3E+16 | 23 |

Each annealed wafer obtained under the manufacturing conditions was measured and evaluated in by tests (1), (2), (3), and (4), presented in more detail below. TEM samples of samples used in measurements of (1) and (2) was obtained as follows. That is, the wafers were polished by a precision polisher to predetermined depths (50 μm, 100 μm, and 300 μm), and the samples were obtained from a center portion of the wafer and a portion distanced from an edge by 10 mm. An OPP was set such that a focus is set to predetermined depths (5 μm and 15 μm from a surface layer) of the wafers and predetermined positions (center, and 10 mm from edge).

(1) Determination of BMD Shape

The same measurement sample was measured twice while changing a scan direction of an OPP into <110> direction and <100> direction, and BMD oblateness was determined by a ratio of signal intensities obtained by both the measurements. More specifically, a relationship between the ratio of the signal intensities and the BMD oblateness was examined in advance, and oblateness was calculated from the ratio of the signal intensities. Measurement was also performed by a TEM. At this time, the oblateness was measured and calculated from a microscopic image viewed from the [001] direction. From these results, BMD shape determination was performed. At least 10 BMDs in each of the samples were measured, and all obtained oblatenesses were averaged to calculate an average oblateness. It was determined whether the average oblatenesses exceeded 1.5.

(2) BMD Size and Concentration

Sizes and concentrations were obtained by measuring a portion having a depth of less than 20 μm from a surface layer by using an OPP and measuring a portion having a depth of 50 μm or more by using TEM. From observation results of the BMDs obtained by the following methods, concentrations of BMDs each having a predetermined size were calculated. As the concentration of BMDs each having the predetermined size, an average value at three portions at a predetermined depth was used.

Measurement by OPP: By using an OPP available from AXENT Technologies, a signal intensity obtained by performing signal processing electrically to a phase difference of transmitting lasers caused by BMDs was measured. As the measurement range in the depth direction, a range in a depth of ±5 μm from the setting was used. More specifically, when a focus was set at a position in a depth of 5 μm from a surface, a range from a depth of 0 μm to 10 μm was measured. When the focus was set at a position in a depth of 15 μm from the surface, a range from a depth 10 μm to 20 μm was measured. A size correction of BMDs was performed as follows. BMDs having known sizes were measured by an OPP, and a correction curve of the signal intensities and BMD sizes was formed. The correction curve will be described below.

BMD diagonal length (nm) having an octahedron shape=153×(OPP signal)0.43

By using the correction curve, BMD sizes were calculated from signal intensities. In calculation of the sizes, a ghost signal removing process (K. Nakai Review of Scientific Instruments, vol. 69 (1998) pp. 3283) was performed. A detection sensitivity was set to a sensitivity at which a BMD having a diagonal length of 80 nm or more could be measured.

Measurement by TEM: from a microscopic image obtained by measurement, a concentration of BMDs each having a predetermined size was calculated. The concentration was calculated from the number of BMDs observed in the field of view and the volume of a sample corresponding to an observed region.

(3) Nitrogen Concentration of Annealed Wafer

A sample was extracted from an annealed wafer and polished by 20 μm to remove a nitrogen outward diffusion layer on the surface. Thereafter, a nitrogen concentration was measured.

(4) Slip Length of Annealed Wafer and Warpage Resistance Evaluation

A heat treatment (to be referred to as a "pseudo device process heat treatment" hereinafter) described in the following paragraphs was performed on an annealed wafer. Warpages of the annealed wafer before the pseudo device process heat treatment and after the pseudo device process heat treatment were measured by FT-90A available from NIDEK corporation to calculate an increase in warpage=warpage after heat treatment−warpage before heat treatment. An annealed wafer after the pseudo device process heat treatment was observed by an X-ray topograph, and a maximum length of lengths of observed slips was defined as a typical value.

(5) Heat Treatment using Batch Type Heat Treatment Furnace (I): Furnace temperature is held at 900° C., and a wafer is inserted into the furnace.

(II): Wafer is held at a temperature of 900° C. for 30 minutes in an oxygen gas atmosphere, and then the wafer is extracted at 900° C.

(Measurement Results and Evaluation Results of Annealed Wafers)

In Table 2 examples and comparative examples of annealed wafers manufactured under the manufacturing conditions shown in Table 1, measured concentrations of BMDs having a predetermined size, slips, and amounts of warpage occurring in the pseudo device process heat treatment are listed. The wafer manufactured under any of the conditions has a BMD average oblateness was 1.5 or less.

TABLE 2

| No. | Wafer Diameter (mm) | Conductivity Type | Nitrogen (atoms/cm$^3$) | Oxygen (atoms/cm$^3$) | Carbon (atoms/cm$^3$) | Diffusion Length of Interstitial Oxygen in High-temperature Heat Treatment (μm) | BMD concentration 1 Surface Layer from 0 to 20 μm (1/cm$^3$) 200 nm≤ | BMD concentration 2 Inside Bulk (1/cm$^3$) 10 nm≤ 50 nm≥ | Slip (mm) | Amount of Warpage (μm) |
|---|---|---|---|---|---|---|---|---|---|---|
| Example 1 | 200 | P | 1.3E+15 | 9.2E+17 | 1.5E+15 | 52 | 1.1E+09 | 2.0E+12 | 7.8 | 1.3 |
| Example 2 | 200 | P | 1.4E+15 | 9.0E+17 | 3.5E+15 | 52 | 2.0E+09 | 3.2E+12 | 4.7 | 0.0 |
| Example 3 | 200 | N | 1.9E+15 | 9.3E+17 | 2.6E+15 | 52 | 1.9E+09 | 2.2E+12 | 8.7 | 1.5 |
| Example 4 | 200 | P | 1.6E+15 | 9.2E+17 | 4.7E+15 | 52 | 1.6E+09 | 3.0E+12 | 8.2 | 1.7 |
| Example 5 | 200 | P | 2.4E+15 | 8.8E+17 | 8.1E+15 | 52 | 1.8E+09 | 3.0E+12 | 0.9 | 6.4 |
| Comp. Example 1 | 200 | P | 1.3E+1.5 | 9.2E+17 | 1.5E+15 | 23 | 5.2E+09 | 2.0E+12 | 5.5 | 14.6 |
| Comp. Example 2 | 200 | N | 1.9E+15 | 9.3E+17 | 2.6E+15 | 23 | 7.9E+09 | 2.4E+12 | 5.8 | 39.6 |
| Comp. Example 3 | 200 | P | 3.3E+15 | 8.6E+17 | 1.0E+16 | 23 | 9.1E+09 | 2.4E+12 | 7.0 | 99.1 |
| Comp. Example 4 | 200 | P | 1.4E+15 | 9.0E+17 | 3.5E+15 | 23 | 6.2E+09 | 3.0E+12 | 2.9 | 33.3 |
| Comp. Example 5 | 200 | P | 1.4E+15 | 8.7E+17 | 3.3E+15 | 23 | 8.4E+08 | 4.8E+11 | 12.5 | 6.0 |
| Comp. Example 6 | 200 | P | 3.2E+15 | 8.6E+17 | 1.3E+16 | 23 | 7.1E+09 | 7.6E+11 | 11.0 | 72.2 |

In this case, a "surface layer" BMD concentration in Table 2 is a concentration of BMDs having a size of 200 nm or more, and an "inside bulk" of BMD concentration means a concentration of BMDs having a size of 10 nm or more to 50 nm or less. A value of a concentration of the "surface layer" is a sum of concentrations measured at a depth of 5 μm and a depth of 15 μm.

According to these results, the followings were obtained:

(i) A surface layer of a BMD concentration is $2\times10^9$/cm$^3$ or less, and the inside "bulk" BMD concentration is $1\times10^{12}$/cm$^3$ or more. For this reason, the slip length is 10 mm or less, and the amount of warpage is suppressed to 10 μm or less.

(ii) A nitrogen concentration of an annealed wafer doped with nitrogen was not different from a nitrogen concentration measured in the substrate.

(iii) Slips and warpages of a P-type and an N-type were not different from each other.

(iv) The same effects were obtained in the divided heat treatments and the batch heat treatment.

(v) Even in wafers in which nitrogen, oxygen, and carbon concentration in a substance were the same, both of slip characteristic and warpage could be satisfied when the diffusion length of interstitial oxygen was set to 50 μm.

(vi) Even in wafers in which nitrogen, oxygen, and carbon concentrations in a substrate were the same, if the low-temperature heat treatments were changed, only one of a slip characteristic or a warpage characteristic could be satisfied. However, both characteristics could not be simultaneously satisfied.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

[1. A silicon wafer having a nitrogen concentration which is from $\geq 5\times10^{14}$ atoms/cm$^3$ to $\leq 1\times10^{16}$ atoms/cm$^3$, a carbon concentration which is from $\geq 1\times10^{15}$ atoms/cm$^3$ to $\leq 8.1\times10^{15}$ atoms/cm$^3$, and containing BMDs having an octahedral shape, wherein BMDs located at a position below the silicon wafer surface at a depth of less than 20 μm and having a diagonal length of 200 nm or more are present in a concentration of $\leq 2\times10^9$/cm$^3$, and BMDs located at a depth of more than 50 μm from the wafer surface and having a diagonal length of ≥10 nm to ≤50 nm are present in a concentration of $\geq 1\times10^{12}$/cm$^3$.]

2. A method of manufacturing a silicon wafer, containing BMDs having an octahedral shape, wherein BMDs located at a position below the silicon wafer surface at a depth of less than 20 μm and having a diagonal length of 200 nm or more are present in a concentration of $\leq 2\times10^9$/cm$^3$, and BMDs located at a depth of more than 50 μm from the wafer surface and having a diagonal length of ≥10 nm to ≤50 nm are present in a concentration of $\geq 1\times10^{12}$/cm$^3$, comprising:

supplying a wafer substrate having a nitrogen concentration of $\geq 5\times10^{14}$ atoms/cm$^3$ to $\leq 1\times10^{16}$ atoms/cm$^3$, and a carbon concentration of $\geq 1\times10^{15}$ atoms/cm$^3$ to $\leq 3\times10^{16}$ atoms/cm$^3$, heat treating the wafer substrate by a treatment comprising at least the following steps, in the order given:

(A) a low-temperature heat treatment in a temperature range of ≥650° to ≤750° C. for a time of ≥30 minutes to ≤5 hours;

(B) a heat treatment which increases the temperature in a temperature range of up to 850° C. at a heating rate of ≥0.5° C./minute to ≤2° C./minute;

(C) a cooling and extracting step of decreasing the furnace temperature at a cooling rate of ≥1° C./minute to ≤10° C./minute after step (B), and extracting the wafer from the furnace when the temperature of the furnace is ≥600° C. to ≤750° C., and cooling the wafer to a room temperature; and (D) a high-temperature heat treatment wherein the furnace is set to ≥600° C. to ≤750° C. after step (C), inserting the wafer into the furnace, raising the temperature of the furnace in the temperature range of ≤1100° C. at a heating rate of ≥5° C./minute to ≤10° C./minute, raising the temperature in the temperature range of ≥1100° C. to ≤1250° C. at a heating rate of ≥1° C./minute to ≤2° C./minute, and holding the wafer at a temperature of ≥1000° C. to ≤1250° C. to provide a diffusion length of inter-lattice oxygen of 50 μm or more.

3. A method of manufacturing a silicon wafer containing BMDs having an octahedral shape, wherein BMDs located at a position below the silicon wafer surface at a depth of less than 20 μm and having a diagonal length of 200 nm or more are present in a concentration of $\leq 2\times10^9$/cm$^3$, and BMDs located at a depth of more than 50 μm from the wafer surface and having a diagonal length of ≥10 nm to ≤50 nm are present in a concentration of $\geq 1\times10^{12}$/cm$^3$, comprising:

supplying a wafer substrate having a nitrogen concentration of $\geq 5\times10^{14}$ atoms/cm$^3$ to $\leq 1\times10^{16}$ atoms/cm$^3$, a carbon concentration of $\geq 1\times10^{15}$ atoms/cm$^3$ to $\leq 3\times10^{16}$ atoms/cm$^3$ or less, heat treating the wafer substrate by a heat treatment comprising at least the following steps in the order given:

(A) a low-temperature heat treatment in a temperature range of ≥650° C. to ≤750° C. for a time of ≥30 minutes to ≤5 hours;

(B) a heat treatment which increases the temperature in a temperature range of up to 850° C. at a heating rate of ≥0.5° C./minute to ≤2° C./minute; and (C) a high-temperature heat treatment wherein heating to less than 1100° C. is performed at a heating rate of ≥5° C./minute to ≤10° C./minute, and in a temperature range of ≥1100° C. to ≤1250° C. at a heating rate of ≥1° C./minute to ≤2° C./minute, and holding the wafer at a temperature of ≥1000° C. to ≤1250° C. to provide a diffusion length of inter-lattice oxygen of 50 μm or more.

*4. The method of claim 2, wherein the wafer substrate has an interstitial oxygen concentration of $8.0\cdot10^{17}$ atoms/cm$^3$ to $9.5\cdot10^{17}$ atoms/cm$^3$.*

*5. The method of claim 2, wherein the carbon concentration is from $1\cdot10^{15}$ atoms/cm$^3$ to $2\cdot10^{16}$ atoms/cm$^3$.*

*6. The method of claim 4, wherein the carbon concentration is from $1\cdot10^{15}$ atoms/cm3 to $2\cdot10^{16}$ atoms/cm$^3$.*

*7. The method of claim 3, wherein the wafer substrate has an interstitial oxygen concentration of $8.0\cdot10^{17}$ atoms/cm$^3$ to $9.5\cdot10^{17}$ atoms/cm$^3$.*

*8. The method of claim 3, wherein the wafer substrate has an interstitial oxygen concentration of $8.0\cdot10^{17}$ atoms/cm$^3$ to $9.5\cdot10^{17}$ atoms/cm$^3$.*

*9. The method of claim 7, wherein the carbon concentration is from $1\cdot10^{15}$ atoms/cm$^3$ to $2.10^{16}$ atoms/cm$^3$.*

* * * * *